United States Patent
Kim et al.

(10) Patent No.: US 7,710,757 B2
(45) Date of Patent: May 4, 2010

(54) MAGNETIC TRACK USING MAGNETIC DOMAIN WALL MOVEMENT AND INFORMATION STORAGE DEVICE INCLUDING THE SAME

(75) Inventors: Kwang-seok Kim, Seongnam-si (KR); Sung-chul Lee, Osan-si (KR); Sun-ae Seo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/073,103

(22) Filed: Feb. 29, 2008

(65) Prior Publication Data
US 2009/0040883 A1 Feb. 12, 2009

(30) Foreign Application Priority Data
Aug. 10, 2007 (KR) .................. 10-2007-0080844

(51) Int. Cl.
*G11C 19/00* (2006.01)
(52) U.S. Cl. .................. 365/81; 365/171; 365/130; 365/158; 977/933
(58) Field of Classification Search .......... 365/171, 365/173, 158, 131, 66, 48, 78, 80–93, 100, 365/130, 148, 225.5, 243.5; 257/421, E21.665; 438/3; 977/933, 934, 935
See application file for complete search history.

(56) References Cited

U.S. PATENT DOCUMENTS 6,834,005 B1 * 12/2004 Parkin .................. 365/80
2005/0018478 A1 * 1/2005 Nagase et al. ............ 365/171
2005/0078509 A1 * 4/2005 Parkin .................. 365/158
2005/0078511 A1 * 4/2005 Parkin .................. 365/171
2005/0186686 A1 * 8/2005 Chen et al. ............... 438/3
2006/0120132 A1 * 6/2006 Parkin .................. 365/80
2007/0278603 A1 * 12/2007 Ochiai et al. ............ 257/421
2008/0080092 A1 * 4/2008 Kim .................... 360/110
2008/0080234 A1 * 4/2008 Iwata et al. ............. 365/171

OTHER PUBLICATIONS

Magnetically Engineered Spintronic Sensors and Memory, by S. Parkin et al., Proceedings of the IEEE, vol. 91, No. 5, May 2003, pp. 661-680.*

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

Provided are a magnetic track using magnetic domain wall movement and an information storage device including the same. A magnetic track may comprise a zigzag shaped storage track including a plurality of first magnetic layers in parallel with each other, and stacked separate from each other, and a plurality of second magnetic layers for connecting the plurality of first magnetic layers. The information storage device may include the magnetic track having a plurality of magnetic domains, current applying device connected to the magnetic track, and a read/write device on a middle portion of the magnetic track.

22 Claims, 3 Drawing Sheets

MAGNETIC TRACK USING MAGNETIC DOMAIN WALL MOVEMENT AND INFORMATION STORAGE DEVICE INCLUDING THE SAME

PRIORITY STATEMENT

This application claims priority under 35 U.S.C. §119 to Korean Patent Application No. 10-2007-0080844, filed on Aug. 10, 2007, in the Korean Intellectual Property Office (KIPO), the entire contents of which are incorporated herein by reference.

BACKGROUND

1. Field

Example embodiments relate to a magnetic track and an information storage device. Other example embodiments relate to a magnetic track using magnetic domain wall movement and an information storage device including the same.

2. Description of the Related Art

Non-volatile information storing devices include a hard disc drive (HDD) and a random access memory (RAM). A conventional HDD may be a device for reading and writing information by floating a read/write head on a disk-shaped magnetic recording medium while rotating the magnetic recording medium. A conventional HDD also may be a non-volatile information storage device that is capable of storing relatively large amounts of data, and may be used as a main storage device of a computer. However, the HDD may include a relatively large number of moving mechanical systems. When the HDD is moved or affected by shock, the systems may cause various mechanical troubles, and therefore the mobility and reliability of the HDD may be deteriorated. In addition, the mechanical systems may increase electrical power consumption and manufacturing cost of the HDD, and may cause various noises.

An example of a conventional flash memory is a non-volatile RAM. However, flash memory may have relatively slow reading and writing speeds and a relatively short life span. Memory devices, e.g., ferroelectric random access memory (FRAM), magnetic random access memory (MRAM), and phase change random access memory (PRAM), have been developed. However, because the flash memory, FRAM, MRAM, and PRAM all include a switching device in each memory cell, the memory cell area is difficult to reduce. Also, these memories have relatively small storage capacities when compared to a HDD.

Therefore, as a method of solving the drawbacks of the conventional non-volatile information storing devices as described above, storage devices have been developed, which are capable of storing relatively large amounts of data while not including moving mechanical systems and a relatively great number of switching devices. An example of this storage device is an information storage device using magnetic domain wall movement.

Magnetic fine regions constituting a magnetic material may be called magnetic domains. Directions of magnetic moments in a magnetic domain are the same. A magnetic domain wall may be a boundary region of magnetic domains having different magnetization directions from each other, and may have a predetermined or given volume. Such magnetic domains and magnetic domain walls may be moved in a magnetic material by a current or magnetic field applied to the magnetic material. When using the principle of magnetic domain and magnetic domain wall movement, an information storage device being capable of reading/writing data without mechanical movement of a recording medium and a read/write head may be realized.

One example of an information storage device to which principle of magnetic domain wall movement is applied is disclosed in the conventional art. The conventional information storage device may have a U-shaped magnetic track that is perpendicular to a substrate. The magnetic track may include a storage track and a buffer track having a length similar to the length of the storage track, and the buffer track may be any one of two pillar portions of the magnetic track. A plurality of magnetic domains may be continuously arrayed in the storage track, and magnetic domain walls may exist between the magnetic domains. A write head and a read head may be provided below the middle portion of the magnetic track. While moving the magnetic domains and the magnetic domain walls, writing or reading may be performed with the write head or the read head.

However, the magnetic track of the conventional storage device may be formed of a soft magnetic material, e.g., NiFe, having horizontal magnetic anisotropy, and a width of a magnetic domain wall existing in such a soft magnetic material may be as large as several hundred nanometers (nm). Therefore, recording density of the conventional storage device may be difficult to enhance. In addition, because movement of the magnetic domain wall in a soft magnetic material requires a relatively large current of about $10^8$ A/m$^2$, electric power consumption of the conventional storage device may be increased. Additionally, because it is difficult to make the height of the U-shaped magnetic track higher than about 20 μm (the height may be about 10 μm according to the size of a hole in which the U-shaped magnetic track is formed) with present etching and deposition technology, a marked increase of the storage capacity of the conventional storage device may be difficult.

SUMMARY

Example embodiments provide a magnetic track and an information storage device including the same where the recording density and storage capacity are increased and the power consumption is decreased.

According to example embodiments, a magnetic track may comprise a storage track, wherein the storage track is of a zigzag shape, and includes a plurality of first magnetic layers arrayed in parallel, and stacked separate from each other, and a plurality of second magnetic layers for connecting the plurality of first magnetic layers.

The plurality of first magnetic layers may be in parallel with a substrate, and the plurality of second magnetic layers may be perpendicular to the substrate. The plurality of first magnetic layers may be on both ends of a side surface of the plurality of second magnetic layers. The plurality of first magnetic layers may be on the upper and lower surfaces of the plurality of second magnetic layers. The plurality of first magnetic layers may be a plurality of ferromagnetic layers having perpendicular magnetic anisotropy. The magnetic anisotropy energy density K of one of the plurality of first magnetic layers may be in a range of about $2 \times 10^3 \leq K \leq$ about $10^7$ J/m$^3$.

The plurality of first magnetic layers may have a multi-layered structure including a layer formed of at least one of Co and Co alloy and a layer formed of at least one of Pt, Ni and Pd, or a FePt layer or CoPt layer, or a layer formed of an alloy of a rare-earth element and transition metal. The rare-earth element may be at least one of Tb and Gd, and the transition metal may be at least one of Ni, Fe and Co. The plurality of second magnetic layers may be a plurality of ferromagnetic layers or a plurality of soft magnetic layers. The plurality of second magnetic layers may be the same plurality of ferromagnetic layers as the plurality of first magnetic layers.

The magnetic track may include a buffer track connected to the storage track. The buffer track may be reflected symmetrically across a horizontal plane with the storage track. The buffer track may be bilaterally symmetrical with the storage track. The buffer track may be formed of the same material as that of the storage track. The uppermost first magnetic layer of the plurality of first magnetic layers may be formed to be longer than the remaining first magnetic layers.

According to example embodiments, an information storage device may include the magnetic track of example embodiments having a plurality of magnetic domains, current applying device connected to the magnetic track, and a read/write device on a middle portion of the magnetic track.

The current applying device may be a transistor connected to at least one of both ends of the magnetic track. The read/write device may be on a portion of the storage track adjacent to the buffer track. The read/write device may be a single unit device or a double unit device. The single unit device may include first and second pinned ferromagnetic layers on lower and upper surfaces of the magnetic track, and having magnetization direction opposite to each other, and first and second insulation layers between the first and second pinned ferromagnetic layers and the magnetic track. The double unit device may include a read unit and a write unit.

According to example embodiments, an information storage device may include a magnetic track having a plurality of magnetic domains including a storage track, wherein the storage track is of a zigzag shape, and includes a plurality of first magnetic layers arrayed in parallel, and stacked separate from each other, and a plurality of second magnetic layers for connecting the plurality of first magnetic layers, a current applying device connected to the magnetic track, and a read/write device on the magnetic track, wherein the read/write device is on a middle portion of the magnetic track.

BRIEF DESCRIPTION OF THE DRAWINGS

Example embodiments will be more clearly understood from the following detailed description taken in conjunction with the accompanying drawings. FIGS. 1-3B represent non-limiting, example embodiments as described herein.

FIGS. 1 and 2 are perspective views illustrating information storage devices according to example embodiments; and FIGS. 3A and 3B are section views for describing writing operation using a writing device applicable to the information storage device of example embodiments.

Figure 1:
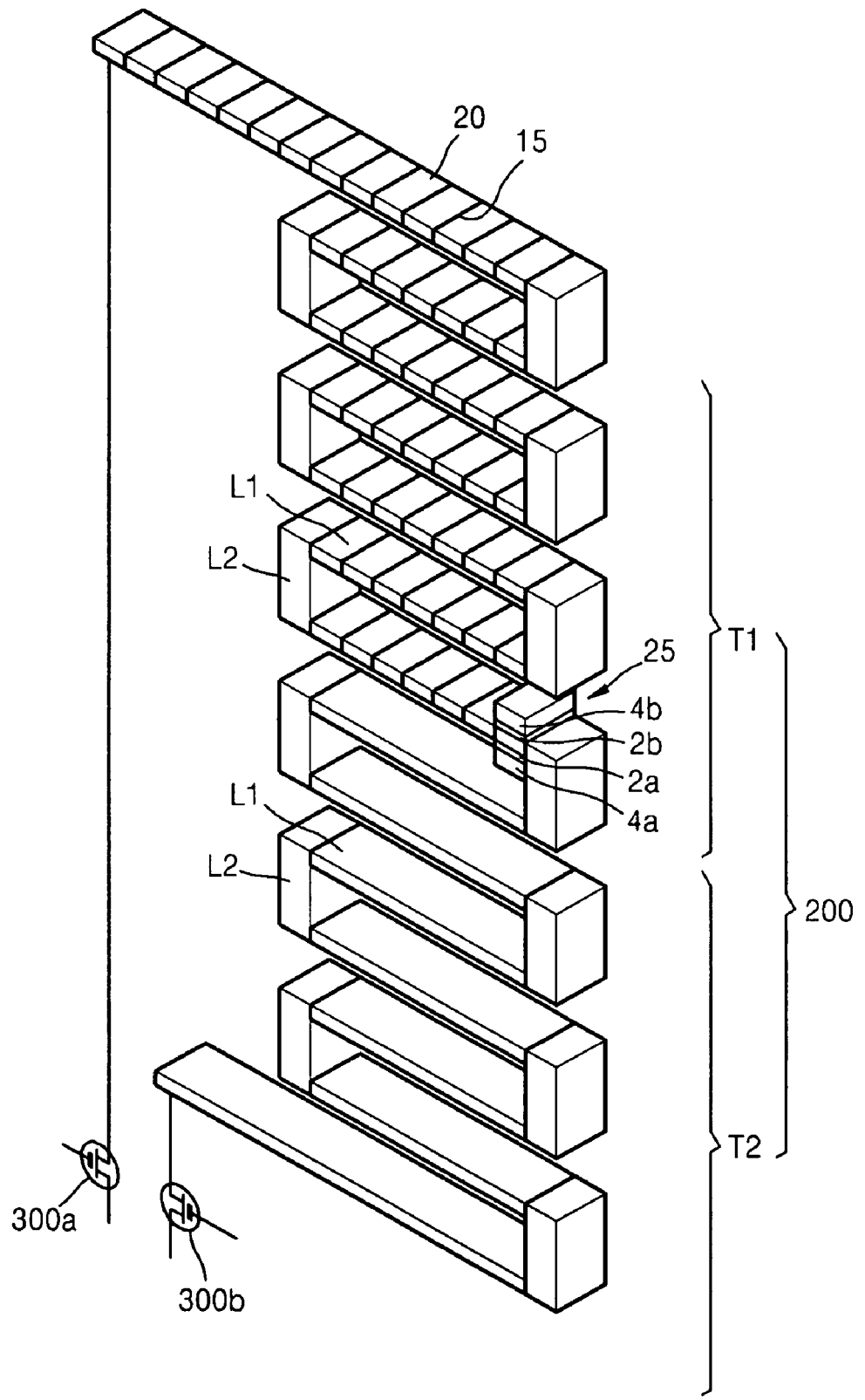

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

An information storage device using magnetic domain wall movement according to example embodiments will be described in detail with reference to attached drawings. Here, thickness of layers or regions shown in drawings is shown in more or less exaggerated manners for the purpose of describing the specification more clearly. In the description and the drawings, similar reference numerals are used to denote similar members.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 shows an information storage device according to example embodiments. Referring FIG. 1, a magnetic track 200 may be divided into a storage track T1 and a buffer track T2 having a length similar to the length of the storage track T1. The storage track T1 may have a zigzag shape including horizontal magnetic layers L1 separate from each other and stacked in a direction perpendicular to a substrate (not shown) and vertical magnetic layers L2 connecting the horizontal magnetic layers L1 to each other in series. The horizontal magnetic layers L1 may be arrayed in parallel with a surface of the substrate, but the horizontal magnetic layers L1 may not be perfectly horizontal.

As shown in FIG. 1, two adjacent horizontal magnetic layers L1 may be provided on both ends of a side surface of the vertical magnetic layer L2, but the two horizontal magnetic layers L1 may also be provided on an upper surface and a lower surface of the vertical magnetic layer L2. The vertical magnetic layer L2 may have a shape of a hexahedron or a cylinder, and spaces between the horizontal magnetic layers L1 may be filled with an insulating material. The length of the uppermost horizontal magnetic layer L1 of the storage track T1 may be longer than the length of the remaining horizontal magnetic layers L1. Thus, the uppermost horizontal magnetic layer L1 may be more easily connected to a first transistor 300a.

The buffer track T2 may be provided below the storage track T1, and the buffer track T2 and the storage track T1 may be disposed so that their reflections are symmetrical across a horizontal plane. However, the lowermost horizontal magnetic layer of the buffer track T2 may be more or less shorter than the uppermost horizontal magnetic layer of the storage track T1. The positions of the storage track T1 and the buffer track T2 may be interchangeable. In FIG. 1, reference numeral 20 denotes a magnetic domain, and reference numeral 15 denotes a magnetic domain wall existing between magnetic domains 20.

The horizontal magnetic layer L1 may be a ferromagnetic layer having perpendicular magnetic anisotropy. For example, the horizontal magnetic layer L1 may have a multi-layered structure in which a first layer formed of at least one of Co and Co alloy and a second layer formed of at least one of Pt, Ni and Pd are alternately stacked, or the horizontal magnetic layer L1 may be a FePt layer or CoPt layer having the $L1_0$ structure, or a layer formed of an alloy of a rare-earth element and a transition metal. The rare-earth element may be at least one of Tb and Gd, and the transition metal may be at least one of Ni, Fe and Co. Anisotropy energy density (K) of the horizontal magnetic layer L1 may be in a range of about $2\times10^3 \leq K \leq$ about $10^7$ J/m$^3$. On the other hand, the vertical magnetic layer L2 may be the same ferromagnetic layer as the horizontal magnetic layer L1, or a soft magnetic layer formed of a material, e.g., Ni, Co, NiCo, NiFe, CoFe, CoZrNb and CoZrCr.

Both ends of the magnetic track 200 may be connected to the first and the second transistors 300a and 300b. The first and second transistors 300a and 300b may apply currents to the magnetic track 200, and may be installed on the substrate (not shown). The first and second transistors 300a and 300b may be connected to the magnetic track 200 with conductive plugs. When a predetermined or given current is applied to the magnetic track 200 using the first and second transistors 300a and 300b, the magnetic domain 20 and the magnetic domain wall 15 may be moved. A direction of the current may vary depending on which one of the first and second transistors 300a and 300b is turned on, and a direction of movement of the magnetic domain 20 and the magnetic domain wall 15 may vary with the direction of the current.

Because the moving direction of electrons is opposite to the direction of a current, the magnetic domain 20 and the magnetic domain wall 15 may be moved in a direction opposite to the direction of the current. Instead of connecting the first and second transistors 300a and 300b to both ends of the magnetic track 200, two transistors may be connected to any one of both ends of the magnetic track 200. A direction of the current applied to the magnetic track may vary depending on which one of the two transistors is turned on. A read/write device 25 may be provided on a middle portion of the magnetic track 200, for example, a portion of the horizontal magnetic layer L1 adjacent to the buffer track T2. The read/write device 25 may include a first ferromagnetic layer 4a and a second ferromagnetic layer 4b formed on a lower surface and an upper surface of the horizontal magnetic layer L1, respectively. First and second insulation layers 2a and 2b may be interposed between each of the first and second ferromagnetic layers 4a and 4b and the horizontal magnetic layer L1. The read/write device 25 will be described later in further detail.

In the conventional storage device having a U-shaped magnetic track, when the U-shaped magnetic track is formed of a perpendicular magnetic anisotropy material, magnetization directions of the magnetic domains may become the same in the whole portion of each pillar portion. However, in the storage device according to example embodiments shown in FIG. 1, because most portions of the magnetic track 200 are in parallel with the substrate (not shown), the magnetic track 200 may be formed of a ferromagnetic material having perpendicular magnetic anisotropy. The width of the magnetic domain wall existing in the ferromagnetic layer may be as small as about several to about several ten nanometers (nm), and the current density (less than about $10^7$ A/m$^2$) required for moving the magnetic domain wall of the ferromagnetic layer may be smaller than the current density (about $10^8$ A/m$^2$) required for moving the magnetic domain wall of the soft magnetic layer. In addition, data recorded in the ferromagnetic layer may be thermally more stable than data recorded in the soft magnetic layer. Therefore, with example embodiments, an information storage device with increased recording density, decreased power consumption, and increased reliability may be realized. In addition, because a plurality of horizontal magnetic layers L1 are arrayed vertically in the information storage device of example embodiments, the storage capacity thereof may be increased more easily by increasing the number of the horizontal magnetic layers L1.

Figure 2:
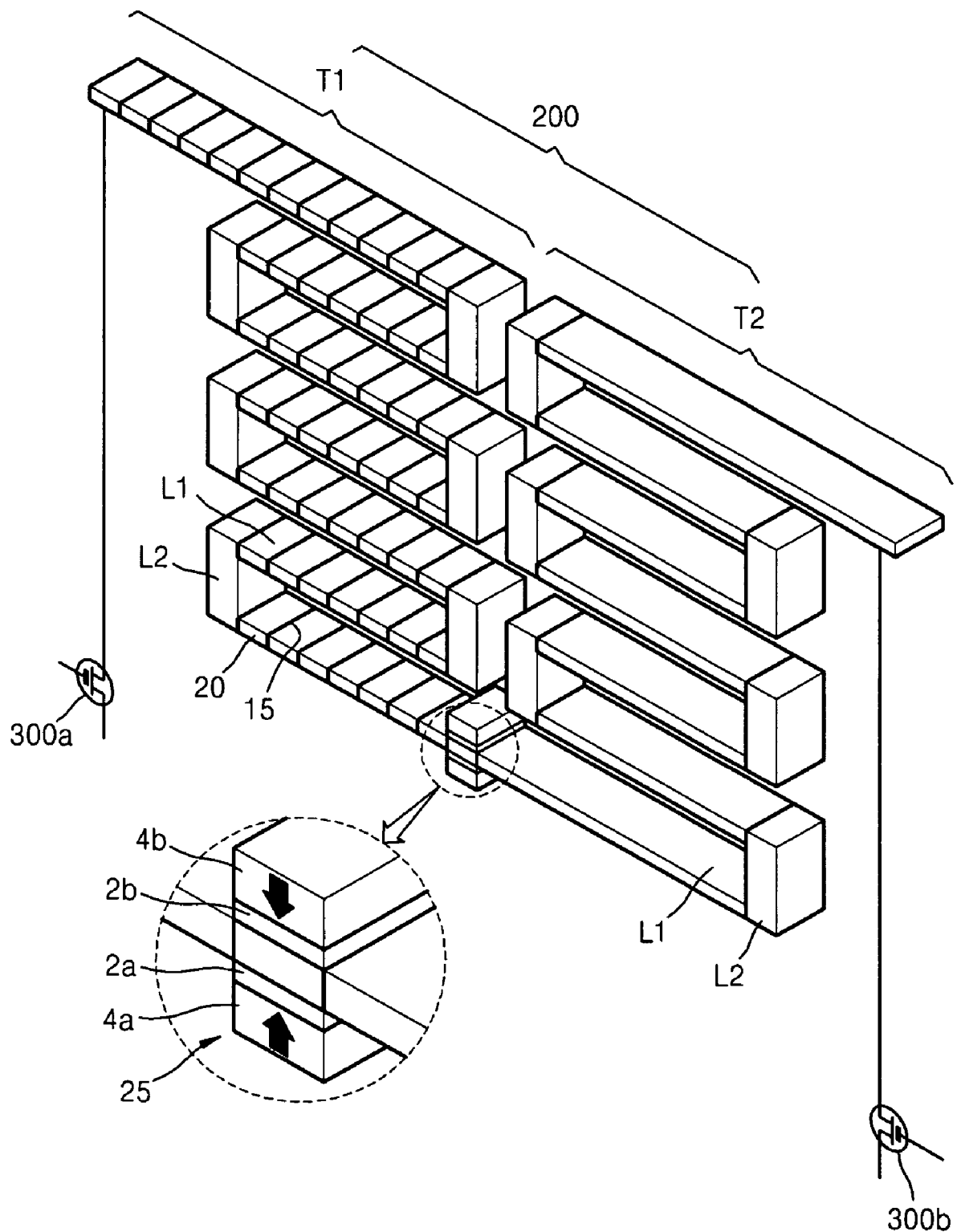

FIG. 2 shows an information storage device using magnetic domain wall movement according to example embodiments. Example embodiments illustrated in FIG. 2 are a variant based on the information storage device of FIG. 1, and a difference between FIG. 1 and FIG. 2 is a positional relationship of a storage track T1 and a buffer track T2.

Referring to FIG. 2, the storage track T1 and the buffer track T2 may be bilaterally symmetrical. The uppermost horizontal magnetic layers of the storage track T1 and the buffer track T2 may be formed to be longer than the remaining horizontal magnetic layers, and may be connected to a first transistor 300a and a second transistor 300b.

Referring to a partially enlarged view of FIG. 2, a read/write device 25 may be provided at a unit bit region of the storage track T1 adjacent to the buffer track T2. The read/write device 25 may include a first ferromagnetic layer 4a and a second ferromagnetic layer 4b formed on a lower surface and an upper surface of the horizontal magnetic layer L1, respectively. The first and second ferromagnetic layers 4a and 4b may be pinned layers having vertical magnetization directions opposite to each other. Arrows shown in the first and second ferromagnetic layers 4a and 4b may indicate respective magnetization directions of the layers 4a and 4b. First and second insulation layers 2a and 2b may be interposed between each of the first and second ferromagnetic layers 4a and 4b and the horizontal magnetic layer L1. The first and second insulation layers 2a and 2b may be oxide layers, and may be formed to be relatively thin so that electron tunneling may occur through the insulation layers 2a and 2b. The read/write device 25 of FIG. 1 has the same structure. The writing principle of the read/write device 25 of example embodiments is described with reference to FIGS. 3A and 3B.

Figure 3A:
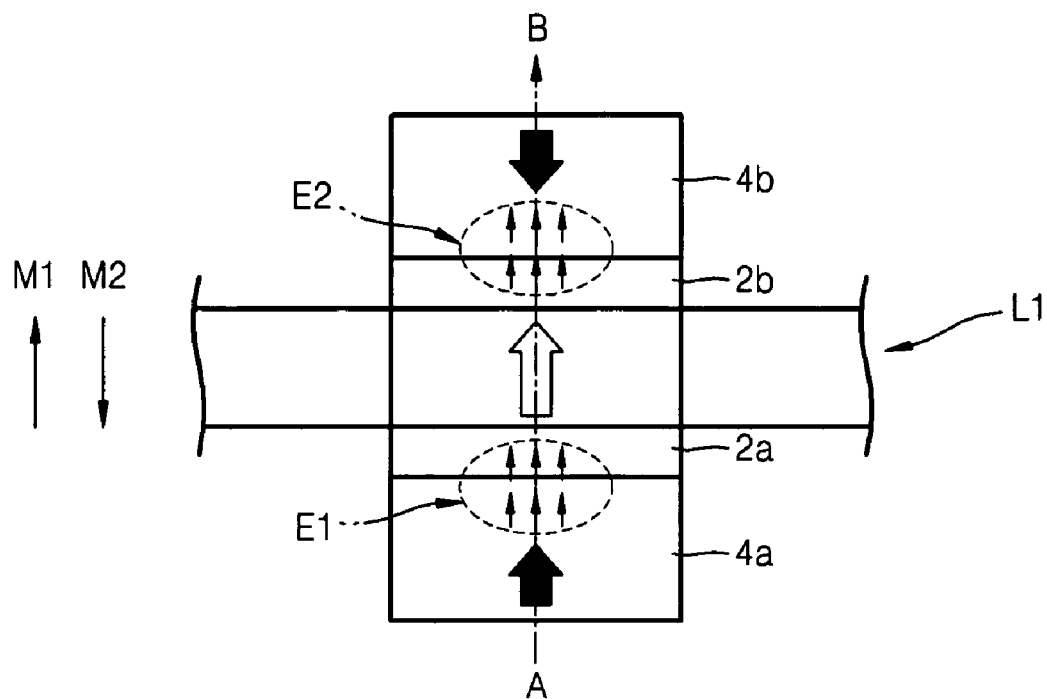

Referring to FIG. 3A, when electrons are moved from the first ferromagnetic layer 4a to the second ferromagnetic layer 4b, for example, when electrons are moved in a direction from A to B in FIG. 3A, electrons E1 having the same magnetization direction (hereinafter, referred to as a first direction) M1 as a magnetization direction of the first ferromagnetic layer 4a are moved to the horizontal magnetic layer L1. Such electrons E1 may serve to magnetize the horizontal magnetic layer L1 in the first direction M1 known as a spin transfer torque effect.

On the other hand, in the second ferromagnetic layer 4b, electrons having the same magnetization direction (hereinafter, referred to as a second direction) M2 as a magnetization direction of the second ferromagnetic layer 4b may pass through the second ferromagnetic layer 4b, but electrons E2 having a magnetization direction opposite to a magnetization direction of the second ferromagnetic layer 4b may not pass through the second ferromagnetic layer 4b, and return to and accumulate on the horizontal magnetic layer L1. Such electrons E2 may serve to magnetize the horizontal magnetic layer L1 in the first direction M1 known as a spin accumulation effect. As described above, first data may be recorded at the horizontal magnetic layer L1 by the spin transfer torque effect and the spin accumulation effect.

Figure 3B:
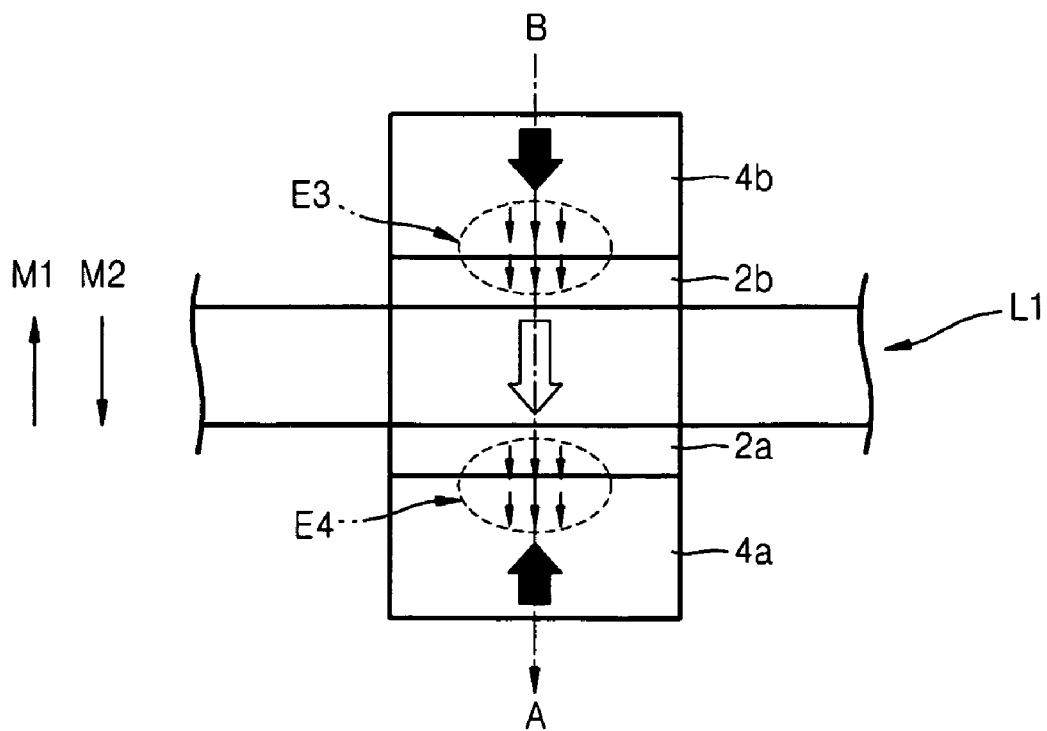

Referring to FIG. 3B, when electrons are moved from the second ferromagnetic layer 4b to the first ferromagnetic layer 4a, for example, when electrons are moved in a direction from B to A in FIG. 3B, electrons E3 magnetized in the second direction M2 may be moved to the horizontal magnetic layer L1. Such electrons E3 may serve to magnetize the horizontal magnetic layer L1 in the first direction M2. On the other hand, in the first ferromagnetic layer 4a, electrons magnetized in the first direction M1 may pass through the first ferromagnetic layer 4a, but electrons E4 magnetized in the second direction M2 may not pass through the first ferromagnetic layer 4a, and return to and accumulate on the horizontal magnetic layer L1. Such electrons E4 may serve to magnetize the horizontal magnetic layer L1 in the second direction M2. Accordingly, second data may be recorded at the horizontal magnetic layer L1.

Thus, in the information storage device according to example embodiments, the first and second ferromagnetic layers 4a and 4b magnetized in directions opposite to each other may be disposed on the lower and upper surfaces of the horizontal magnetic layer L1, and data may be recorded by the spin transfer torque effect and the spin accumulation effect. Therefore, a write current density may become lower than that required when one pinned ferromagnetic layer is used. With the writing principle, predetermined or given data may be recorded on the magnetic track 200 while the magnetic domains 20 and the magnetic domain walls 15 are moved gradually.

On the other hand, the reading principle of the read/write device 25 is briefly described as follows. In FIGS. 1 and 2, an electrical resistance between any one of the first and second ferromagnetic layers 4a and 4b and any one of one end and the other end of the magnetic track 200 may be measured. The electrical resistance may vary according to data recorded at the magnetic track 200 provided with the read/write device 25. Therefore, information recorded on the magnetic track 200 provided with the read/write device 25 may be distinguished by measuring the electrical resistance. With the reading principle, data recorded on the storage track T1 may be reproduced while the magnetic domains 20 and the magnetic domain walls 15 are moved gradually from the storage track T1 to the buffer track T2. When data reproduction is completed, the magnetic domains 20 and the magnetic domain walls 15 of the buffer track T2 may be returned to the storage track T1. Because the first and second insulation layer 2a and 2b act as electrical barriers when a current is applied to the magnetic track 200 in order to move the magnetic domains 20 and the magnetic domain walls 15, the current for moving the magnetic domain walls 15 may not leak to the first and second ferromagnetic layers 4a and 4b.

In the above descriptions, the integrated read/write device (single unit) 25 is shown and described, but a read device and a write device may be provided separately. The read device may be a giant magneto resistance (hereinafter, referred to as "GMR") sensor using a GMR effect, or a tunnel magneto resistance (hereinafter, referred to as "TMR") sensor using a TMR effect. The write device may be a GMR or TMR write unit including one pinned ferromagnetic layer, or a write unit using an external magnetic field. In addition, the read/write device 25 may be used as only a write unit, and a separate read device may be provided.

With example embodiments, because an information storage magnetic track may be formed of a ferromagnetic material having perpendicular magnetic anisotropy, an information storage device with increased recording density and reliability, and decreased power consumption, may be realized. Also, because the magnetic track has a zigzag shape including a plurality of horizontal magnetic layers and vertical magnetic layers in example embodiments, the storage capacity may be increased more easily by increasing the number of the horizontal magnetic layers.

In addition, because an information storage device according to example embodiments may not have a relatively great number of switching devices that are connected to each storage cell, a memory device having a relatively high integration degree may be realized. Although many details are concretely described in the above description, they are not intended to limit the scope of example embodiments, but are construed only as example embodiments. For example, it will be understood by those skilled in the art that the structure of the magnetic track 200 of FIGS. 1 and 2 may be variously modified, the position and structure of the read/write device 25 may be changed in various manners, and the current applying device connected to the magnetic track 200 may be replaced with other devices. In addition, it should be understood that a notch may be formed on a side surface of the magnetic track 200 as a pinning site of the magnetic domain wall 15. Therefore, the scope of example embodiments is not defined by the described embodiments, but is defined by the spirit of the art described in the appended claims.

What is claimed is:

1. A magnetic track comprising:
a storage track, wherein the storage track is of a zigzag shape, and includes:
a plurality of first magnetic layers arrayed in parallel with a substrate and vertically overlapping one another, the plurality of first magnetic layers being stacked separate from each other; and
a plurality of second magnetic layers for connecting the plurality of first magnetic layers.

2. The magnetic track of claim 1, wherein the plurality of second magnetic layers are perpendicular to the substrate.

3. The magnetic track of claim 1, wherein the plurality of first magnetic layers are on both ends of a side surface of the plurality of second magnetic layers.

4. The magnetic track of claim 1, wherein the plurality of first magnetic layers are on the upper and lower surfaces of the plurality of second magnetic layers.

5. The magnetic track of claim 1, wherein the plurality of first magnetic layers are a plurality of ferromagnetic layers having perpendicular magnetic anisotropy.

6. The magnetic track of claim 5, wherein the magnetic anisotropy energy density K of one of the plurality of first magnetic layers is in a range of about $2 \times 10^3 \leq K \leq$ about $10^7$ J/m$^3$.

7. The magnetic track of claim 5, wherein the plurality of first magnetic layers has a multi-layered structure including a layer formed of at least one of Co and Co alloy and a layer formed of at least one of Pt, Ni and Pd, a FePt layer or CoPt layer, or a layer formed of an alloy of a rare-earth element and a transition metal.

8. The magnetic track of claim 7, wherein the rare-earth element is at least one of Tb and Gd, and the transition metal is at least one of Ni, Fe and Co.

9. The magnetic track of claim 1, wherein the plurality of second magnetic layers are a plurality of ferromagnetic layers or a plurality of soft magnetic layers.

10. The magnetic track of claim 5, wherein the plurality of second magnetic layers are the same ferromagnetic layers as the plurality of first magnetic layers.

11. The magnetic track of claim 1, further comprising:
a buffer track connected to the storage track.

12. The magnetic track of claim 11, wherein the buffer track is reflected symmetrically across a horizontal plane with the storage track.

13. The magnetic track of claim 11, wherein the buffer track is bilaterally symmetrical with the storage track.

14. The magnetic track of claim 11, wherein the buffer track is formed of the same material as that of the storage track.

15. The magnetic track of claim 1, wherein the uppermost first magnetic layer of the plurality of the first magnetic layers is formed to be longer than the remaining first magnetic layers.

16. An information storage device comprising:
the magnetic track of claim 1 having a plurality of magnetic domains;
a current applying device connected to the magnetic track; and
a read/write device on the magnetic track.

17. The information storage device of claim 16, wherein the current applying device is a transistor connected to at least one of both ends of the magnetic track.

18. The information storage device of claim 16, wherein the magnetic track further comprises a buffer track connected to the storage track, and the read/write device is on a portion of the storage track adjacent to the buffer track.

19. The information storage device of claim 16, wherein the read/write device is a single unit device or a double unit device.

20. The information storage device of claim 19, wherein the single unit device comprises:
first and second pinned ferromagnetic layers on lower and upper surfaces of the magnetic track, and having magnetization direction opposite to each other; and
first and second insulation layers between the first and second pinned ferromagnetic layers and the magnetic track.

21. The information storage device of claim 19, wherein the double unit device includes a read unit and a write unit.

22. An information storage device comprising:
a magnetic track having a plurality of magnetic domains including a storage track, wherein the storage track is of a zigzag shape, and includes:
a plurality of first magnetic layers arrayed in parallel with a substrate and vertically overlapping one another, the plurality of first magnetic layers being stacked separate from each other;
a plurality of second magnetic layers for connecting the plurality of first magnetic layers;
a current applying device connected to the magnetic track; and a read/write device on the magnetic track, wherein the read/write device is on a middle portion of the magnetic track.

* * * * *